(12) United States Patent
Panchawagh et al.

(10) Patent No.: US 10,943,084 B2
(45) Date of Patent: Mar. 9, 2021

(54) MULTIFUNCTIONAL, MULTIMODAL, UNDER-DISPLAY SENSOR

(71) Applicant: QUALCOMM Incorporated, San Diego, CA (US)

(72) Inventors: Hrishikesh Vijaykumar Panchawagh, Cupertino, CA (US); Nicholas Ian Buchan, San Jose, CA (US); Kostadin Dimitrov Djordjev, Los Gatos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/502,962

(22) Filed: Jul. 3, 2019

(65) Prior Publication Data

US 2021/0004555 A1 Jan. 7, 2021

(51) Int. Cl.
*G06K 9/22* (2006.01)
*G06K 9/00* (2006.01)
*H01L 41/113* (2006.01)
*H01L 41/047* (2006.01)
*G06F 3/041* (2006.01)

(52) U.S. Cl.
CPC ......... *G06K 9/0004* (2013.01); *G06F 3/0414* (2013.01); *G06K 9/0002* (2013.01); *G06K 9/228* (2013.01); *H01L 41/047* (2013.01); *H01L 41/113* (2013.01)

(58) Field of Classification Search
CPC .... G06K 9/228; G06K 9/0002; G06F 3/0414; G06F 3/0416; H01L 41/047; H01L 41/113
USPC ............................................. 345/174; 349/12
See application file for complete search history.

(56) References Cited

U.S. PATENT DOCUMENTS

| | | | | |
|---|---|---|---|---|
| 2014/0354905 A1* | 12/2014 | Kitchens | ............... | G06F 3/0416 349/12 |
| 2015/0123931 A1* | 5/2015 | Kitchens | ............... | G06F 3/0414 345/174 |
| 2018/0101711 A1* | 4/2018 | D'Souza | ............... | G06K 9/228 |

\* cited by examiner

*Primary Examiner* — Abdul-Samad A Adediran
(74) *Attorney, Agent, or Firm* — Weaver Austin Villeneuve & Sampson LLP

(57) ABSTRACT

Techniques described herein address these and other issues by providing an under-display sensor capable of providing fingerprint scanning over an entire display using optical and/or ultrasonic means. To do so, the sensor comprises an array of pixels, where each can pixel comprises a piezoelectric sensor element and a diode capable of being used as a photodetector during a light-sensing mode, and as a peak detector during a pressure-sensing mode. The sensor may further comprise a piezoelectric layer and one or more electrodes, which can generate a pressure wave during the pressure sensing mode.

27 Claims, 11 Drawing Sheets

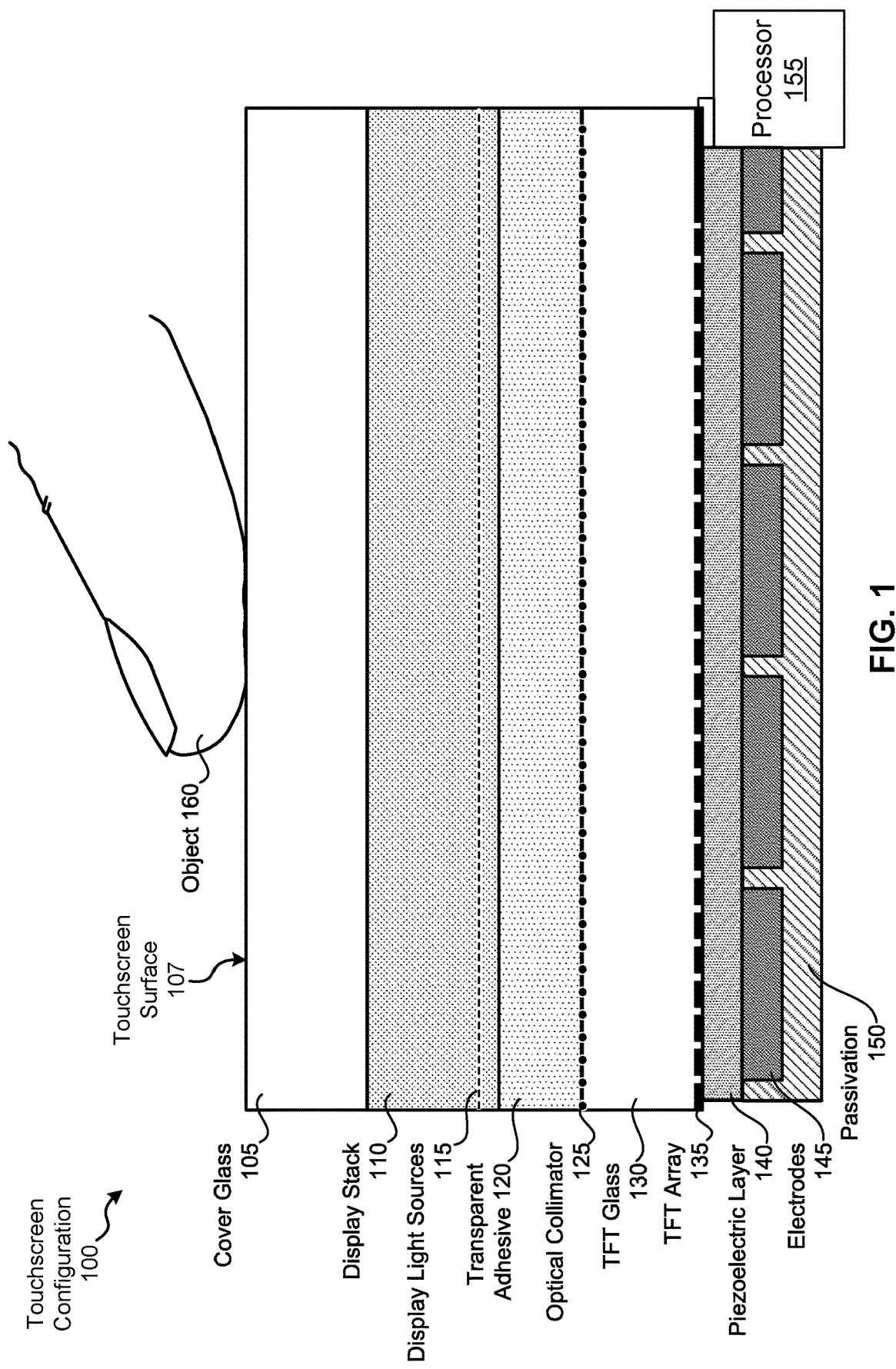

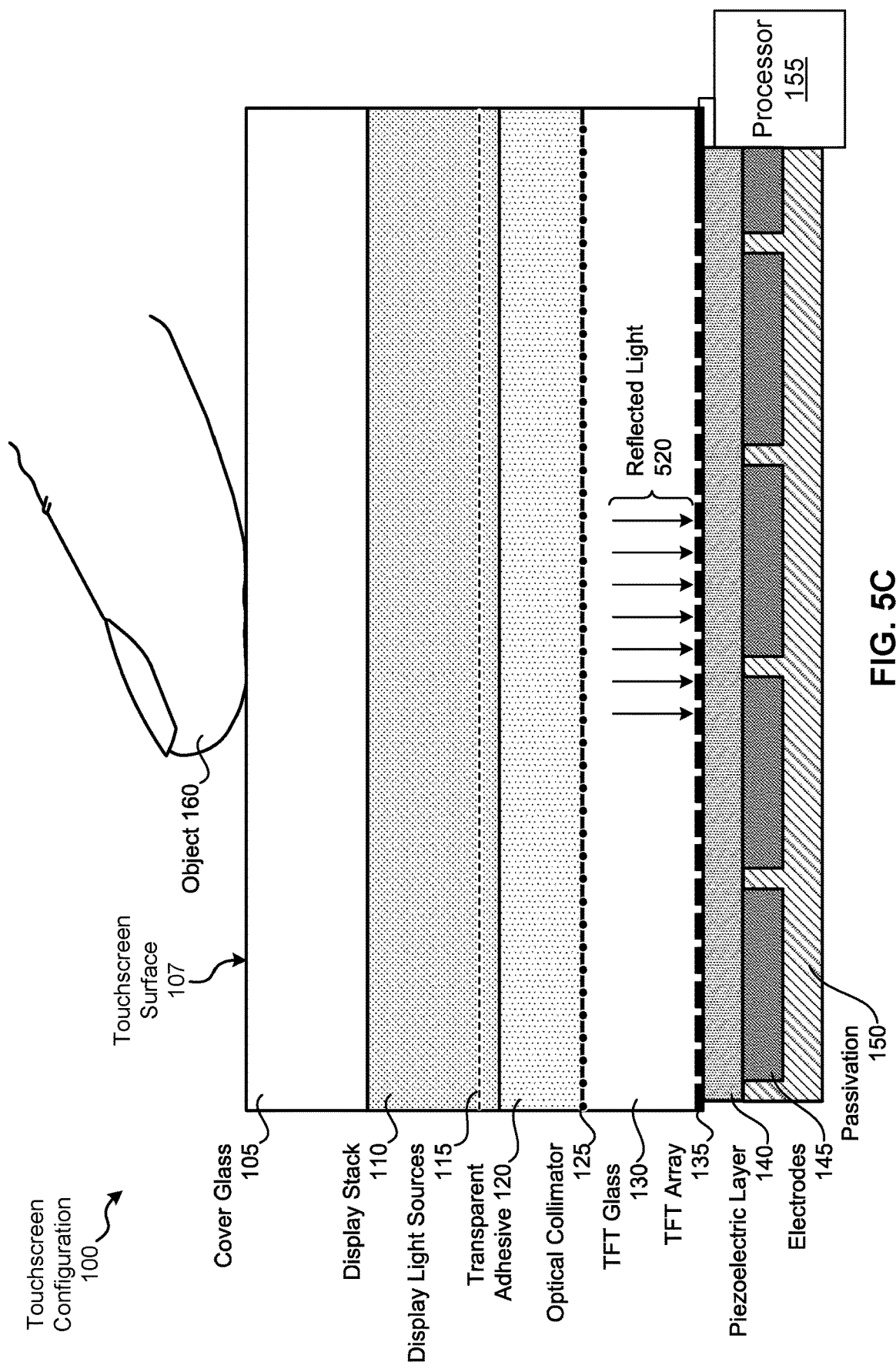

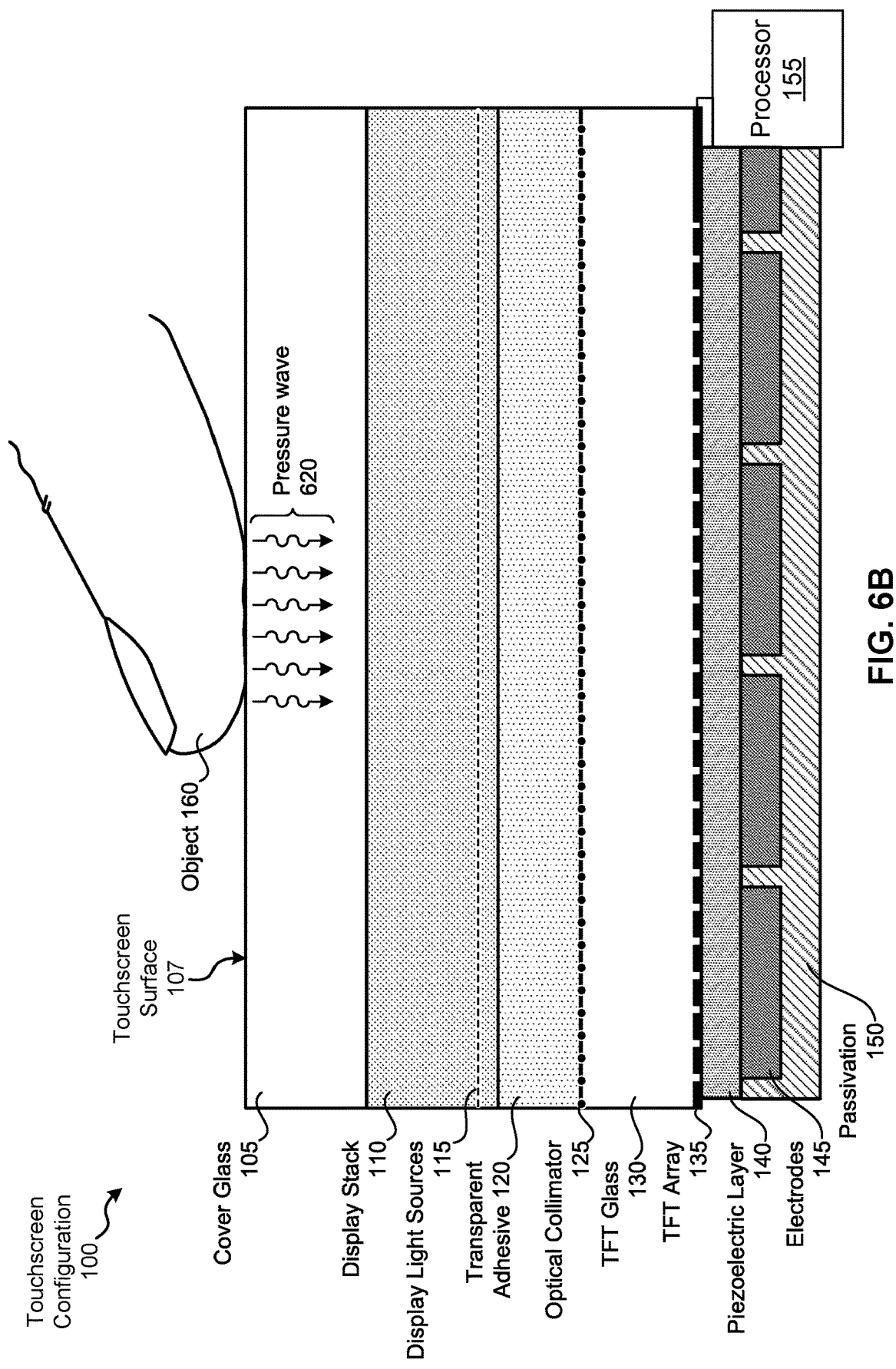

MULTIFUNCTIONAL, MULTIMODAL, UNDER-DISPLAY SENSOR

BACKGROUND

Modern electronic devices, such as cell phones, tablets, laptops, and the like, often utilize touchscreens, which allow users enhanced interactivity with displays. The technologies underlying traditional touchscreens, such as resistance- or capacitive-based touchscreens, allow for various types of interaction with the touchscreen (touch, tap, etc.), but these technologies have their limitations. In particular, modern applications often require fingerprint scanning for security purposes, and traditional touchscreen technologies are largely incapable of accurate fingerprint scanning.

Problematically, however, current fingerprint scanning solutions also have their limitations. Optical fingerprint sensors, for example, can provide fingerprint scanning of a finger in contact with a surface of a display. But optical fingerprint sensors do not offer the additional desirable functionalities of finger multi-touch sensing, force sensing, and stylus tracking. Additional cost is therefore imposed to be able to provide these additional features using separate components.

An example under-display sensor for a touchscreen display, according to the disclosure, comprises a thin-film transistor (TFT) sensor comprising an array of pixels, wherein each pixel in the array of pixels comprises a piezoelectric sensor element, and a diode configured for use as a peak detector during a pressure-sensing mode of the under-display sensor and a photodetector during a light-sensing mode of the under-display sensor. The under-display sensor further includes a piezoelectric layer coupled with the TFT sensor, and one or more electrodes coupled with the piezoelectric layer.

An example method of operating an under-display sensor for a touchscreen display, according to the disclosure, comprises during a light-sensing mode of the under-display sensor, sensing light from a touchscreen surface of the touchscreen display with a thin-film transistor (TFT) sensor comprising an array of pixels, wherein each pixel of the array comprises a respective piezoelectric sensor element and a respective diode, and for each pixel of a first set of pixels of the array, the respective diode operates as a photodetector to perform the sensing of the light. The method further includes, during a pressure-sensing mode of the under-display sensor, sensing, with a second set of pixels of the array, a pressure wave from an object at the touchscreen surface. For each pixel of the second set of pixels the respective piezoelectric sensor element detects the pressure wave, and the respective diode operates as a peak detector.

An example under-display sensor for a touchscreen display, according to the disclosure, comprises means for sensing light from a touchscreen surface of the touchscreen display, during a light-sensing mode of the under-display sensor, wherein the means for sensing light comprises an array of pixels, and wherein each pixel of the array comprises a respective pressure-sensing means and a respective diode, and for each pixel of a first set of pixels of the array, the respective diode operates as a photodetector to perform the sensing of the light. The under-display sensor further comprises means for sensing a pressure wave from an object at the touchscreen surface during a pressure-sensing mode of the under-display sensor sensing, wherein the means for sensing the pressure wave comprise a second set of pixels of the array, and, for each pixel of the second set of pixels the respective pressure-sensing means are configured to detect the pressure wave, and the respective diode operates as a peak detector.

An example non-transitory, computer-readable medium, according to the description, has instructions stored thereby for operating an under-display sensor for a touchscreen display. The instructions, when executed by one or more processors, cause the one or more processors to cause the under-display sensor to enter a light-sensing mode in which a thin-film transistor (TFT) sensor comprising an array of pixels is configured to sense light from a touchscreen surface of the touchscreen display, wherein each pixel of the array comprises a respective piezoelectric sensor element and a respective diode, and for each pixel of a first set of pixels of the array, the respective diode is configured to operate as a photodetector to perform the sensing of the light. The instructions, when executed by one or more processors, further cause the one or more processors to cause the under-display sensor to enter a pressure-sensing mode in which a second set of pixels of the array is configured to sense a pressure wave from an object at the touchscreen surface, wherein, for each pixel of the second set of pixels the respective piezoelectric sensor element is configured to detect the pressure wave, and the respective diode is configured to operate as a peak detector.

BRIEF SUMMARY

Techniques described herein address these and other issues by providing an under-display sensor capable of providing fingerprint scanning over an entire display using optical and/or ultrasonic means. To do so, the sensor comprises an array of pixels, where each pixel comprises a piezoelectric sensor element and a diode capable of being used as a photodetector during a light-sensing mode, and as a peak detector during a pressure-sensing mode. The sensor may further comprise a piezoelectric layer and one or more electrodes, which can generate a pressure wave during the pressure sensing mode.

BRIEF DESCRIPTION OF THE DRAWINGS

FIG. 1 is an illustration of a cross-section of a touchscreen configuration having a display and under-display sensor, according to an embodiment.

FIGS. 5A-5C are cross-sectional diagrams of the touchscreen configuration of FIG. 1, illustrating the operation in a light-sensing mode, according to some embodiments.

FIGS. 6A-6C are cross-sectional diagrams of the touchscreen configuration of FIG. 1, illustrating pressure wave generation and sensing in a pressure-sensing mode, according to some embodiments.

Figure 2A:
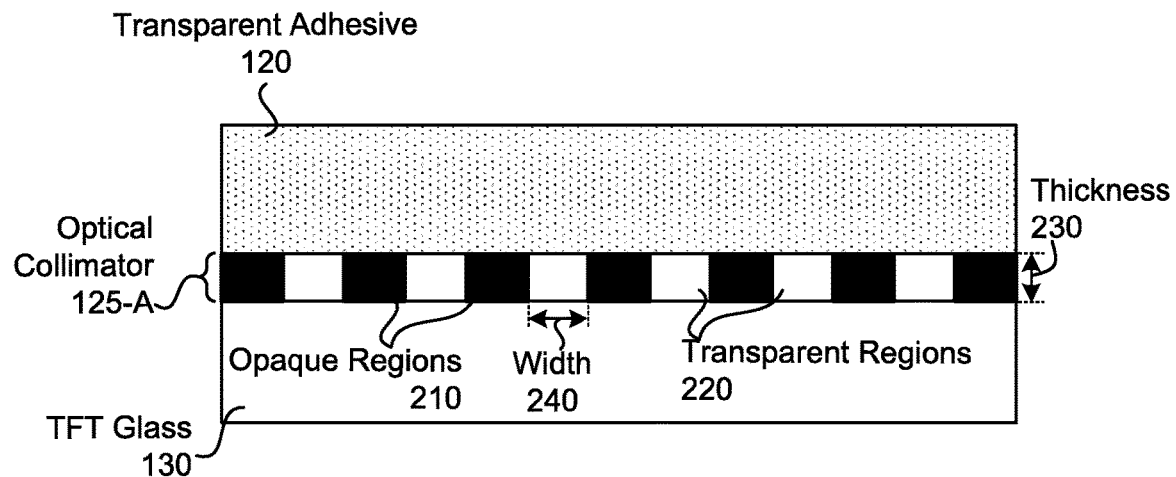
FIGS. 2A-2B are cross-sectional diagrams of an optical collimator, according to embodiments.

Like reference symbols in the various drawings indicate like elements, in accordance with certain example implementations. In addition, multiple instances of an element may be indicated by following a first number for the element with a letter or a hyphen and a second number. For example, multiple instances of an element 110 may be indicated as 110-1, 110-2, 110-3 etc. or as 110a, 110b, 110c, etc. When referring to such an element using only the first number, any instance of the element is to be understood (e.g., element 110 in the previous example would refer to elements 110-1, 110-2, and 110-3 or to elements 110a, 110b, and 110c). Additionally, some figures may have multiple instances of an element, but, to avoid clutter, not all instances may be labeled.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

FIG. 1 is an illustration of a cross-section of a touchscreen configuration 100 having an under-display sensor, according to an embodiment. The touchscreen configuration 100 may be utilized in any of a variety of touchscreen applications where the benefits of using optical and/or ultrasonic under-display sensing (e.g., fingerprint scanning, spoof detection, force sensing, etc.) may be realized. Moreover, the touchscreen configuration 100 can do so in a manner that can be thinner and more cost-effective than traditional solutions. A person of ordinary skill in the art will appreciate that alternative embodiments may utilize a different arrangement of materials and/or layers, and that the components illustrated in FIG. 1 are not shown to scale.

Broadly speaking, the various components of the touchscreen configuration 100 illustrated in FIG. 1 may be selected so as to facilitate sensing of an object 160 (e.g., a finger) on the touchscreen surface 107 by both optical and ultrasonic means. Accordingly, the materials composing the layers of the touchscreen configuration 100 through which light travels may be selected to be transparent, or largely transparent, for the wavelength(s) of light utilized in light sensing. Additionally, the thickness of the various layers may be "tuned" to optimize the energy transfer of an ultrasonic transmission from one medium to the next. Accordingly, some embodiments may therefore utilize layers having thicknesses of half a wavelength of the ultrasonic wave, or a multiple thereof. As a person of ordinary skill in the art will appreciate, wavelength within a component of the touchscreen configuration 100 may vary, based on the material(s) composing the layer. As such, embodiments of the touchscreen configuration 100 can be particularly thin, in comparison with traditional under-display optical sensors. For example, the thickness of layers under the display stack 110 may be around 150 μm thick or less, according to some embodiments. On the other hand, traditional under-display optical sensors can range 1-3 mm thick.

At the top of the touchscreen configuration 100, a cover glass 105 provides the touchscreen surface 107 of the touchscreen configuration 100. The cover glass 105 may comprise any of a variety of materials (including non-glass material such as acrylics), typically chosen to provide durability of the touchscreen display through typical use of the product in which the touchscreen display is incorporated.

The display stack 110 can include a variety of layers composing the display of the touchscreen. This can include a layer comprising the display light sources 115, such as a pixel array (e.g., an organic light emitting diode (OLED) array), along with a polarizing layer, and one or more Optically Clear Adhesive (OCA) and/or Pressure Sensitive Adhesive (PSA) layers to connect the layers within the display stack 110 to each other and to the cover glass 105. Here, the display stack 110 is optically transparent to allow for light-sensing, which is described in more detail below in FIGS. 2A-2B.

The transparent adhesive 120 may comprise an adhesive layer for attaching the upper layers (cover glass 105 and display stack 110) to the lower layers (discussed below). As with other layers in the touchscreen configuration 100, acoustic and optical considerations may impact the thickness and materials chosen for the transparent adhesive 120. In some embodiments, for example, the transparent adhesive 120 may comprise an OCA, PSA, double-sided tape, ultraviolet (UV) curable adhesives, epoxy, or the like. The transparent adhesive 120 may have a thickness that is less than 15 μm thick (or tuned to a multiple half of the acoustic wavelength at an operation frequency (e.g., a generated ultrasonic frequency)), and may have an acoustic impedance of roughly 1-3 MRayl (generally, the higher the better). As a person of ordinary skill in the art will appreciate, tuning the transparent adhesive 120 to a specific thickness may be more important for a relatively low-impedance transparent adhesive 120 than it is for a relatively high-impedance transparent adhesive 120, due to the fact that relatively high-impedance transparent adhesive's 120 have a broader range of thicknesses that provide a good signal. The transparent adhesive 120 may additionally or alternatively have a longitudinal speed of sound range of 1100-2500 m/s (generally, the higher the better), and an Adiabatic Young's modulus Range of 0.8-2.5 GPa at 15 MHz (generally, the higher the better). Alternative embodiments may have different properties, depending on desired functionality.

An optical collimator 125 is then located between a transparent adhesive 120, and a TFT glass 130. The optical collimator 125 filters light traveling downwards through the configuration to allow only light substantially perpendicular to this touchscreen surface 107 to travel downward through the TFT glass 130 toward the thin-film-transistor (TFT) array 135. In some embodiments, there may be a second transparent adhesive (not illustrated) adhering the optical collimator 125 to the TFT glass 130. This may be dependent, for example, on the methods by which the optical collimator 125 is manufactured.

The optical collimator 125 may comprise any of a variety of materials to provide the collimation functionality described herein. It may comprise, for example, a pinhole array and/or micro lens array. In the case of a pinhole array, the optical collimator 125 may comprise one or more layers having opaque regions and transparent regions therein, as illustrated in FIGS. 2A-2B.

Figure 2B:
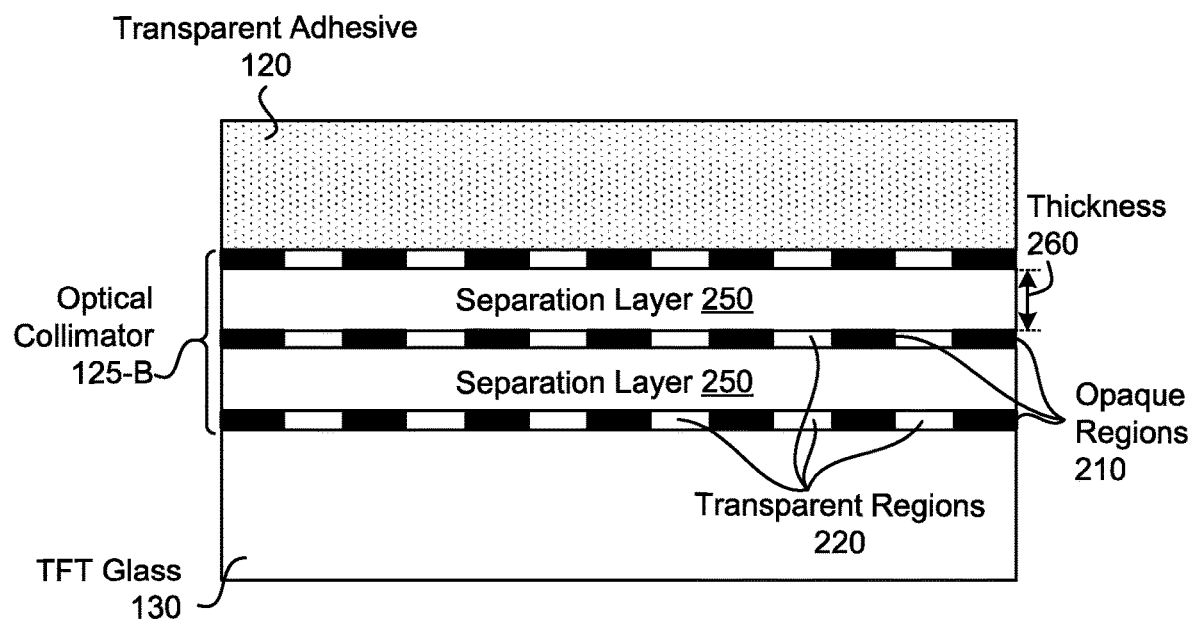

FIG. 2A is an illustration of a cross-section of a first type of optical collimator 125-A, according to an embodiment. Here, optical collimator 125-A comprises a single layer comprising opaque regions 210. The layer further comprises transparent regions 220 through which light can travel from the transparent adhesive 120. The opaque regions 210 may comprise an opaque material, such as metal (e.g., nickel or copper), polycarbonate (PC), polyethylene terephthalate (PET), Teflon™, Acrylic, or similar material films. Although the transparent regions 220 in FIG. 2A are illustrated as having a substantially uniform distribution, size, shape, etc., these and other features may vary, depending on means of manufacture and/or other factors.

The transparent regions 220 may comprise a substantially transparent material through which light may travel from the transparent adhesive 120 to the TFT glass 130. As such, the transparent regions 220 may comprise holes in an opaque material filled with a transparent material (e.g., plastic, UV curable adhesives, epoxy, thermosetting materials, die attach adhesives.) or other medium through which light may travel. To help ensure the light is substantially collimated, the transparent regions may have a high aspect ratio. In some embodiments, the aspect ratio may be within the range of 5:1 to 50:1, although other embodiments may have a higher or lower aspect ratio. According to some embodiments, for example, the optical collimator 125-A may have a thickness 230 of 9 to 75 µm and transparent regions 220 may have a width 240 of 0.2-15 µm in diameter. In some embodiments, the optical collimator 125-A may comprise a metal deposited onto the TFT glass 130 and subsequently patterned to form the opaque regions 210 and the transparent regions 220. Other embodiments may be formed in different ways, may have different materials, and/or may have different dimensions, depending on desired functionality.

Techniques for manufacturing the optical collimator 125-A may vary, depending on the material(s) used. In some embodiments, for example, the material from which the optical collimator 125-A is formed may natively comprise holes, and the manufacturing process can further include filling the holes with one or more transparent plastic materials to form transparent regions 220. For materials not comprising holes natively upon formation, transparent regions 220 may be formed after formation of an opaque layer using gamma and/or neutron radiation. Additionally or alternatively, transparent regions 220 may be subtractively formed in an opaque layer using laser drilling, embossing, wet etching, photolithography, or dry etching. Additionally or alternatively, opaque regions 210 and/or transparent regions 220 may be additively formed using tampo printing or 3D printing. Additional or alternative techniques for forming the opaque regions 210 and/or transparent regions 220 may be utilized.

FIG. 2B is an illustration of a cross-section of a second type of optical collimator 125-B, according to another embodiment. Here, the optical collimator 125-B has multiple layers with opaque regions 210 and transparent regions 220. (Note that only a portion of opaque regions 210 and transparent regions 220 are labeled, to avoid clutter.) Here, the layers may be relatively thin (e.g., 1 µm or less), and therefore may not have the relatively high aspect ratio of the layer comprising the optical collimator 125-A of FIG. 2A. Accordingly, to help ensure collimation of light traveling from the transparent adhesive 120 to the TFT glass 130, layers of transparent regions 220 and opaque regions 210 may be separated by one or more separation layers 250. The separation layers 250 may comprise a transparent material (e.g., plastic or glass) and may have a sufficient thickness 260 to help ensure collimation. In some embodiments, for example, the thickness 260 of the separation layers 250 may be on the order of tens of microns (e.g., 10 µm or more). Alternative embodiments, however, may have a larger or smaller thicknesses 260, depending on desired functionality.

It can be noted that, regardless of the number of layers of transparent regions 220 and opaque regions 210 an embodiment of an optical collimator 125 may employ, additional considerations may be taken into account to assure the optical collimator 125 has sufficient acoustic transmission for pressure sensing. To ensure good ultrasonic transmission through collimator, the collimator may be designed to create minimal acoustic mismatch by using similar acoustic impedance layer or by keeping high impedance material thickness as low as possible. In some embodiments, air voids would be minimized or eliminated in the collimator design to mitigate acoustic impedance mismatch.

Returning again to FIG. 1, the touchscreen configuration 100 further comprises a TFT array 135, piezoelectric layer 140, and electrodes 145, which are operable to provide light sensing in a light-sensing mode and provide ultrasonic transmission and pressure sensing in a pressure-sensing mode, as illustrated below with regard to FIGS. 4A-6C. The sensing circuitry of the TFT array 135 is further illustrated in FIGS. 3-4B. According to some embodiments, the piezoelectric layer 140 may comprise a blanket deposited and/or patterned layer of piezoelectric material. The piezoelectric layer 140 may comprise, for example, polyvinylidene fluoride (PVDF), PVDF-trifluoroethylene (PVDF-TrFE), lead-zirconate-titanate (PZT), Aluminium nitride (AlN), and/or composites of the same. The electrodes 145 may comprise a conductive material (e.g., silver (Ag) ink), which may be patterned as desired to provide voltage to the piezoelectric layer 140 for generating and sensing an ultrasonic pressure wave, as described herein below. The touchscreen configuration 100 further includes passivation 150, providing electrical isolation of the electrodes 145.

As described in further detail herein below, the electrodes 145 and piezoelectric layer 140 may be utilized to generate an ultrasonic pressure wave used to detect an object 160 on the touchscreen surface 107. (As used herein, the term "ultrasonic" may refer to frequencies of 5 to 40 MHz, although embodiments are not necessarily limited to these frequencies. The sensing of lower frequencies, for example, can be used for other features like touch, heart rate, etc.) Depending on the number of electrodes used, the generation of the ultrasonic pressure wave may be localized to a certain portion of the touchscreen. That is, in some embodiments, there may be few electrodes 145 (e.g., as few as one electrode), in which case the electrodes 145 may generate an ultrasonic pressure wave for the entire touchscreen. In other embodiments, electrodes 145 may be more prevalent, in which case a subset of electrodes may be used to generate the ultrasonic pressure wave at only a localized region of the touchscreen where the presence of the object 160 is anticipated (e.g., an area designated for fingerprint scanning within a graphical user interface displayed by the touchscreen).

The TFT array 135 and/or electrodes 145 may be communicatively coupled with a processor 155. (It can be noted that, for simplicity, the processor 155 is illustrated merely as a block. In practice, the processor 155 may be physically separate from the other components in the touchscreen configuration 100, and may comprise one or more integrated circuits (ICs).) The processor 155 can include without limitation one or more general-purpose processors, one or more special-purpose processors (such as application specific integrated circuits (ASICs) and/or the like), and/or other processing structure or means. The processor 155 may communicate with the TFT array 135 and/or electrodes 145 to provide the optical and/or pressure sensing by the TFT array 135, as well as the generation of an ultrasonic pressure wave by the piezoelectric layer 140, as described herein.

Figure 3:
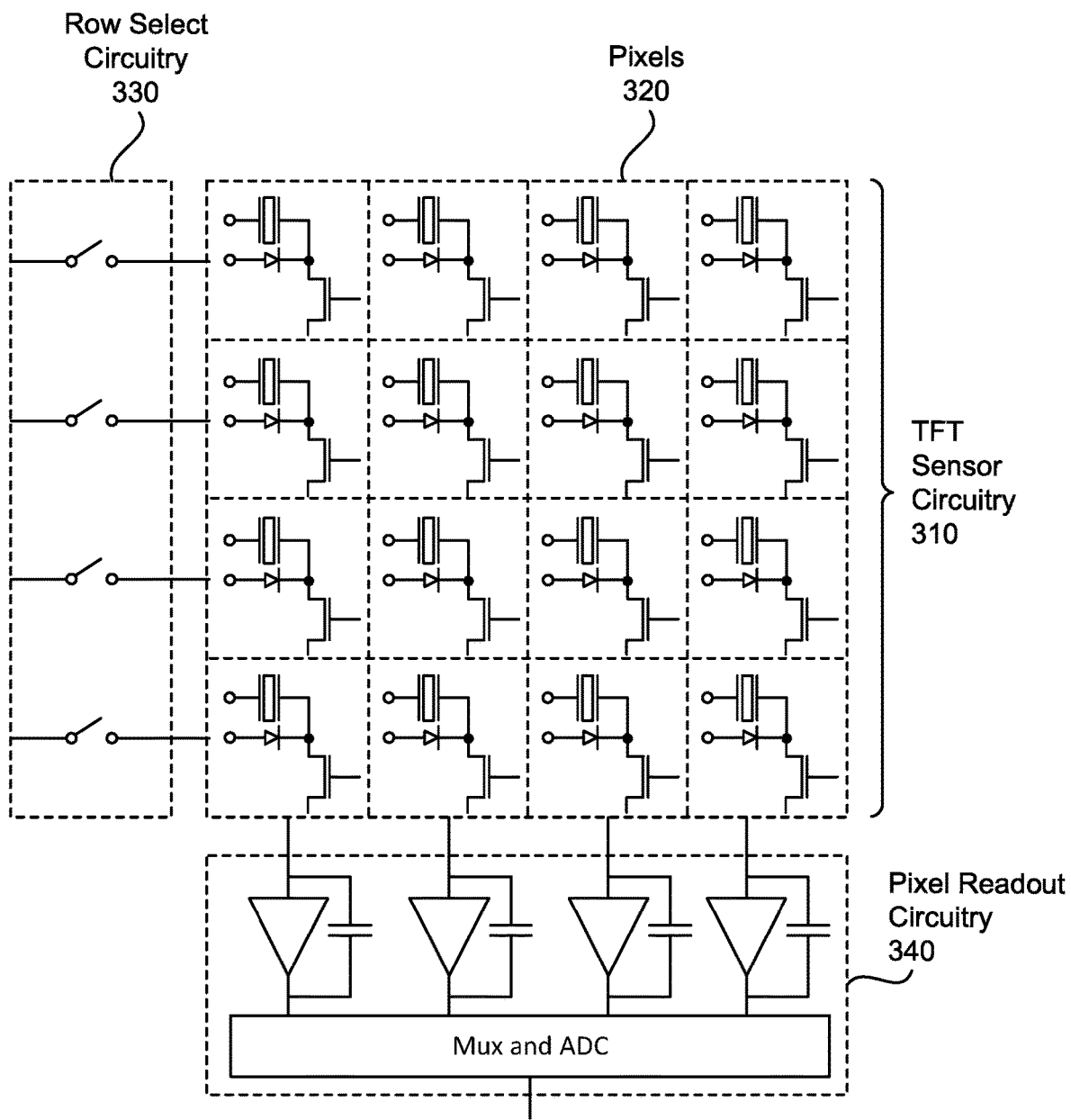
FIG. 3 is an illustration of sensor circuitry and peripheral circuitry, according to an embodiment.

FIG. 3 is an illustration of the TFT sensor circuitry 310 in the TFT array 135, with peripheral circuitry, according to an embodiment. It will be understood that, in alternative embodiments, the TFT sensor circuitry with 310 may comprise an array of pixels 320 larger or smaller than that illustrated in FIG. 3. In practice, embodiments may comprise hundreds of thousands or millions of pixels 320, for example, although other embodiments may have a larger or smaller number of pixels. Here, rows select circuitry 330 may select rows of pixels 320 in the TFT sensor circuitry 310 from which to read sensed values (e.g., voltages or currents) generated during an optical and/or pressure-sensing mode. According to some embodiments, the pixel readout may occur a row at a time, based on a row selected by the row select circuitry 330. Pixel values are obtained by the pixel readout circuitry 340, which converts pixel values to digital values. The pixel readout circuitry 340 then provides digital values to a processor (e.g., the FPC of FIG. 1) or other circuitry for determination of the location of the object 160 on the touchscreen surface 107. Additional details regarding the operation of the pixels 320 in light-sensing and pressure-sensing modes are provided below.

Figure 4A:
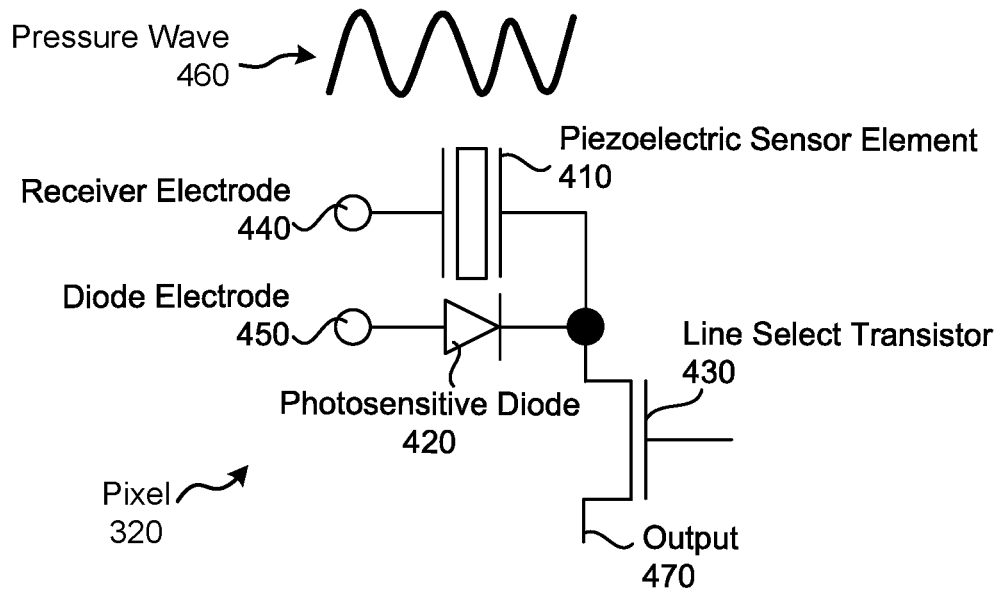
FIGS. 4A and 4B are schematic diagrams illustrating the operation of a sensor pixel during pressure-sensing mode and light-sensing mode, respectively.

FIG. 4A is a schematic diagram illustrating the components and operation of a pixel 320 during pressure-sensing mode operation, according to an embodiment. Here, the pixel 320 comprises a piezoelectric sensor element 410, a photosensitive diode 420, and line-select transistor 430. Both the piezoelectric sensor element 410 and photosensitive diode 420 can be operated in part by voltages applied at receiver electrode 440 and diode electrode 450, respectively.

The pixel 320 may operate to detect the various types of pressure waves 460 in a pressure-sensing mode. For example, the piezoelectric sensor element 410 may be capable of detecting a pressure wave 460 generated by a user tapping or pressing an object 160 to the touchscreen surface 107. Additionally or alternatively, the pixel 320 may operate to detect a pressure wave generated by the piezoelectric layer 140, which reflects off of an object 160 on the touchscreen surface 107. To provide this latter functionality, the pixel 320 may operate in both "transmit" and "receive" modes, to transmit and receive the pressure wave 460. For example, in a transmit mode, a voltage can be provided at one or more of the electrodes 145 while the receiver electrodes 440 for the pixels 320 in the TFT sensor circuitry 310 are grounded, to create a voltage across the piezoelectric layer 140, causing the piezoelectric layer 140 to generate an ultrasonic pressure wave. The TFT sensor circuitry 310 can then switch to a receive mode in which the electrodes 145 are then held at a reference potential and individual piezoelectric sensor elements 410 are used to sample the pressure wave 460 (e.g., as reflected off an object 160 on the touchscreen surface 107). In the receive mode, the photosensitive diode 420 can operate as a regular diode (e.g., allowing current flow in one direction only) to ensure that peak charge is stored on the piezoelectric sensor element 410. The charge can then be read at the output 470 when the line select transistor 430 is activated (e.g. by the row select circuitry 330 of FIG. 3).

Figure 4B:
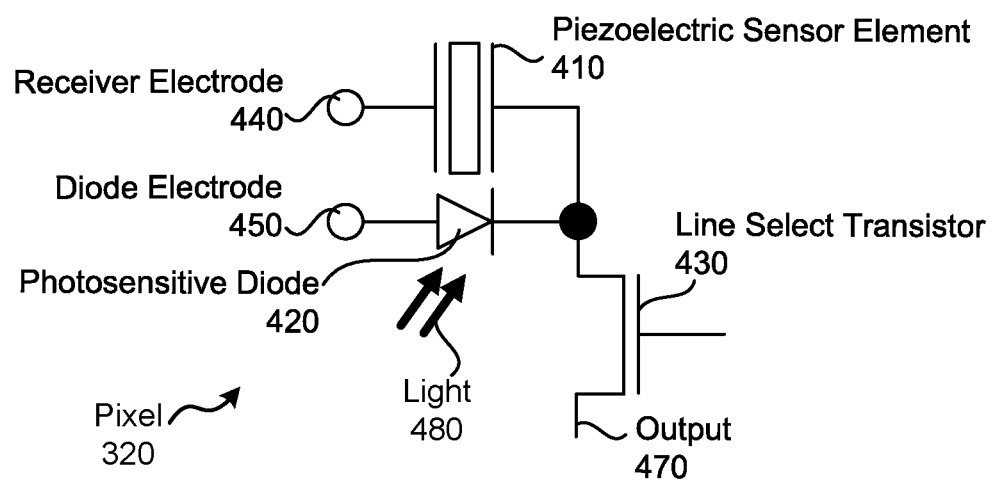

FIG. 4B illustrates the components and operation of a pixel 320 during light-sensing mode, according to an embodiment. Here, the photosensitive diode 420 absorbs light 480 reflected from an object 160 on the touchscreen surface 107, generating electron-hole pairs from the absorbed photons, which cause a current to flow across the photosensitive diode 420. Activation of the line select transistor 430 can provide the current at the output 470, which can be integrated over time.

In some embodiments, the piezoelectric sensor element 410 also may be capable of operating in a photoacoustic mode for generating an image of a finger or similar object 160. In the photoacoustic mode, a light source (e.g., one or more of the display light sources 115) may be used as a transmitter to burst very short pulses of light (e.g. 10-100 ns). These light pulses are absorbed into finger tissue to generate a heat pulse, which expands the tissue in the finger to generate a pressure wave. This pressure wave may then detected by one or more piezoelectric sensor elements 410 to form an image of the finger. This operability could be used, for example, for fingerprint imaging or anti-spoof.

It will be understood that alternative embodiments of a pixel 320 may have a different configuration of components than those illustrated in FIGS. 4A and 4B. For example, a pixel 320 may include additional capacitive or switching components to store and/or read charge differently. Such alterations may be made based on desired functionality, manufacturing concerns, and/or other factors.

Because the photosensitive diode 420 is capable of detecting light during the pressure-sensing mode, embodiments may synchronize light and pressure wave generation to help isolate detection of the pressure wave 460 and light 480. For example, light from the display light sources 115 may be briefly turned off during all or a portion of the pressure-sensing mode to help minimize the amount of light 480 absorbed by the photosensitive diode 420 and generated current resulting therefrom. Such operation, therefore, helps maximize the signal-to-noise ratio (SNR) during pressure-sensing mode.

Figure 5A:
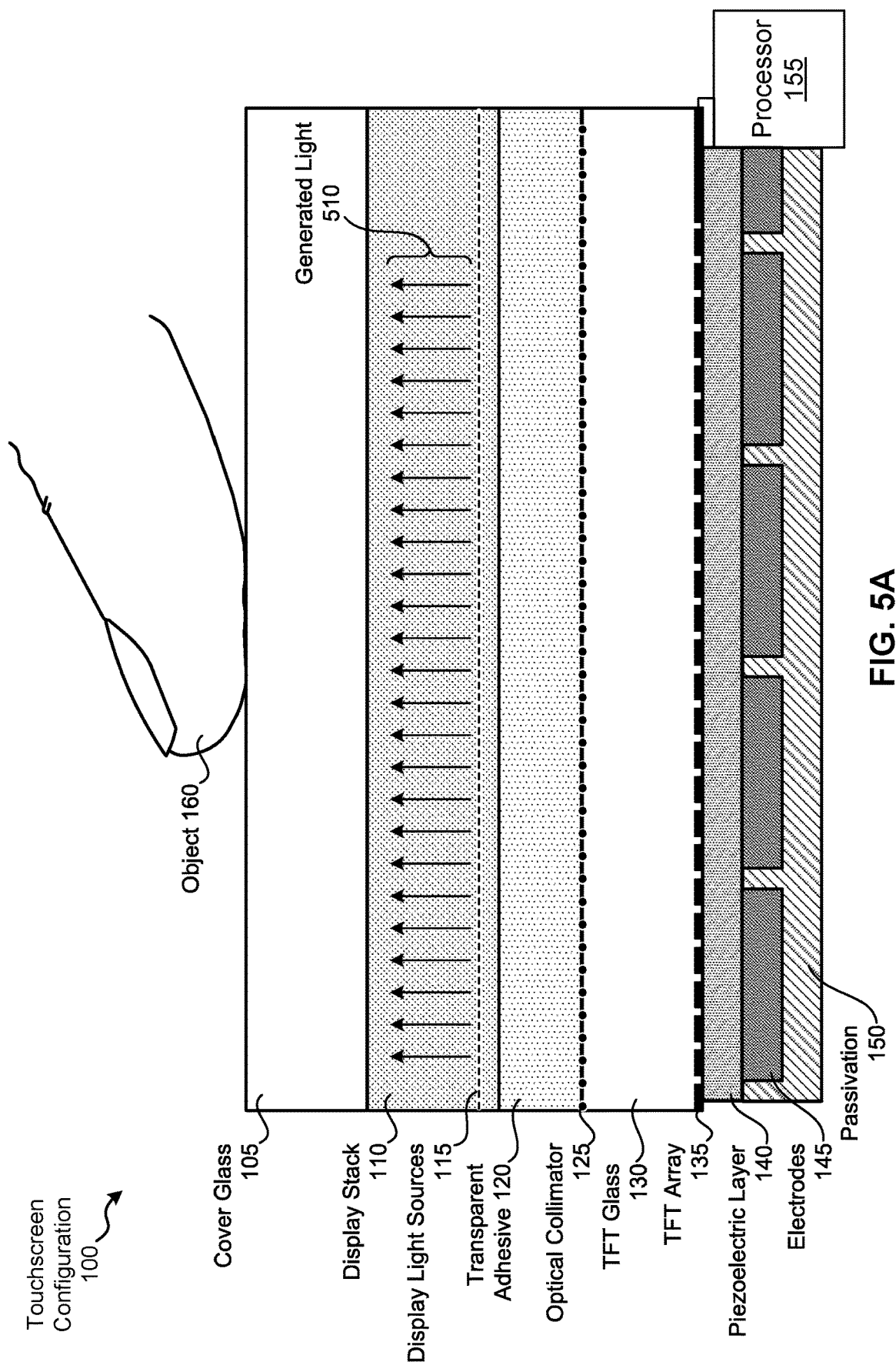
Figure 5B:
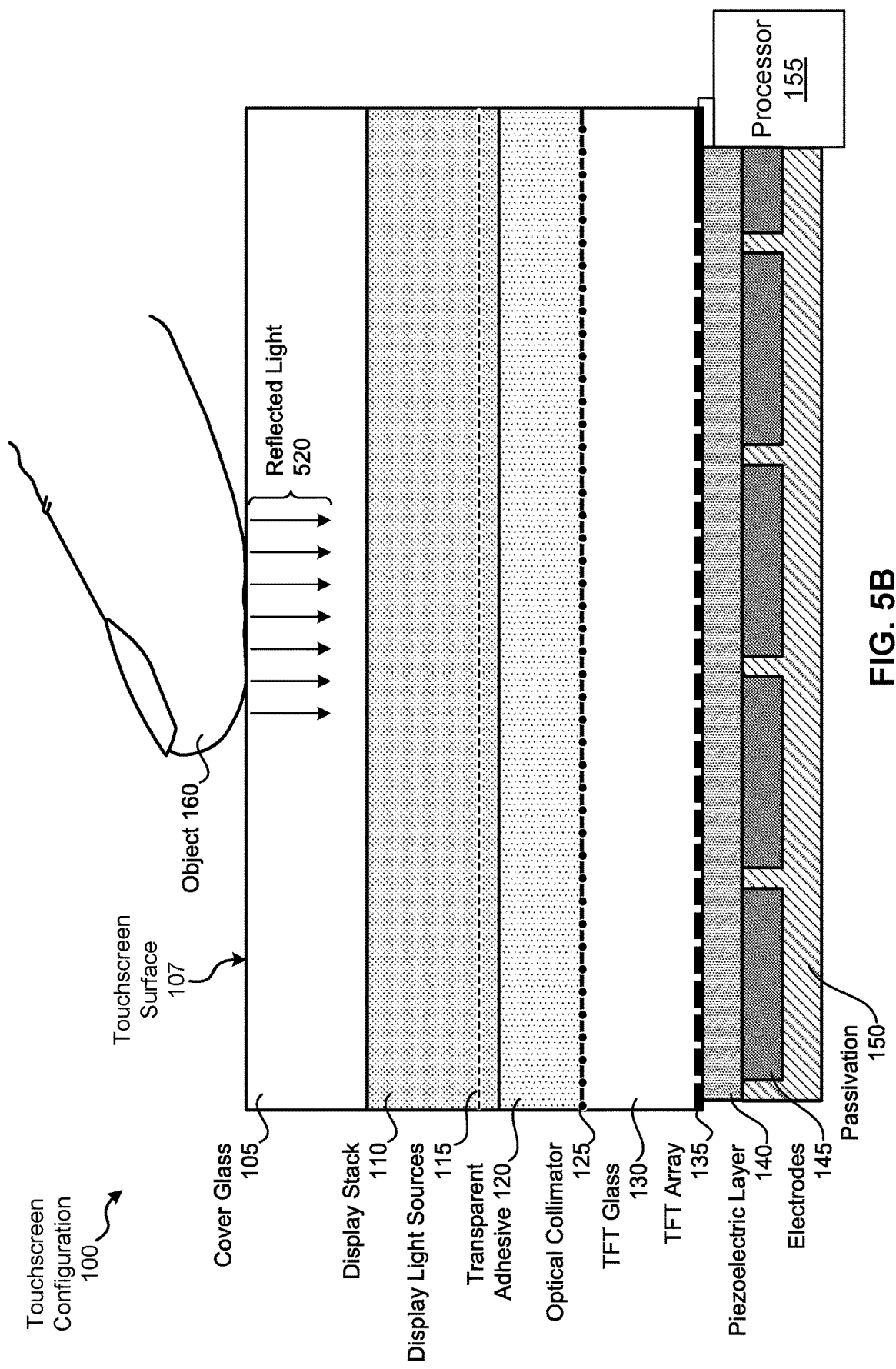

FIGS. 5A-5C are cross-sectional diagrams of the touchscreen configuration 100, illustrating the operation of the various components thereof in a light-sensing mode, according to some embodiments. In FIG. 5A, generated light 510 is emitted from display light sources 115 in the display stack 110. As noted above, display light sources 115 may comprise pixels of a display of the touchscreen configuration 100. The generated light 510 may therefore be emitted during normal operation of the touchscreen display. Additionally or alternatively, the display light sources 115 may be configured to emit certain frequencies and/or display a certain pattern of generated light 510 to optimize the detection of the object 160 during the light-sensing mode. The generated light 510 then travels upward through the display stack 110 and cover glass 105.

In FIG. 5B, light reflects off the object 160 at the touchscreen surface 107. (The remaining generated light 510, which is not illustrated in FIG. 5B, may continue to travel upward away from the touchscreen surface 107 or may be partially absorbed by the object 160.) The reflected light 520 then travels downward through the cover glass 105 and the lower layers. Although the reflected light 520 is illustrated as being substantially perpendicular to the touchscreen surface 107, there may be reflected light 520 that reflects at an angle that is not substantially perpendicular to the touchscreen surface 107. However, as noted above, reflected light 520 that is not substantially perpendicular to the touchscreen surface 107 will be filtered and/or redirected by the optical collimator 125 (e.g., using a pinhole array as illustrated in FIGS. 2A-2B and/or a micro lens array) so that once the reflected light reaches the TFT array 135, it is substantially perpendicular to the touchscreen surface 107, as illustrated in FIG. 5C. Once the reflected light 520 reaches the TFT array 135, it is detected by the various pixels 320 of the TFT sensor circuitry 310 in the TFT array 135, as previously described. Based on the location of the pixels 320, the location of the object 160 on the touchscreen surface 107 can be determined.

Figure 6A:
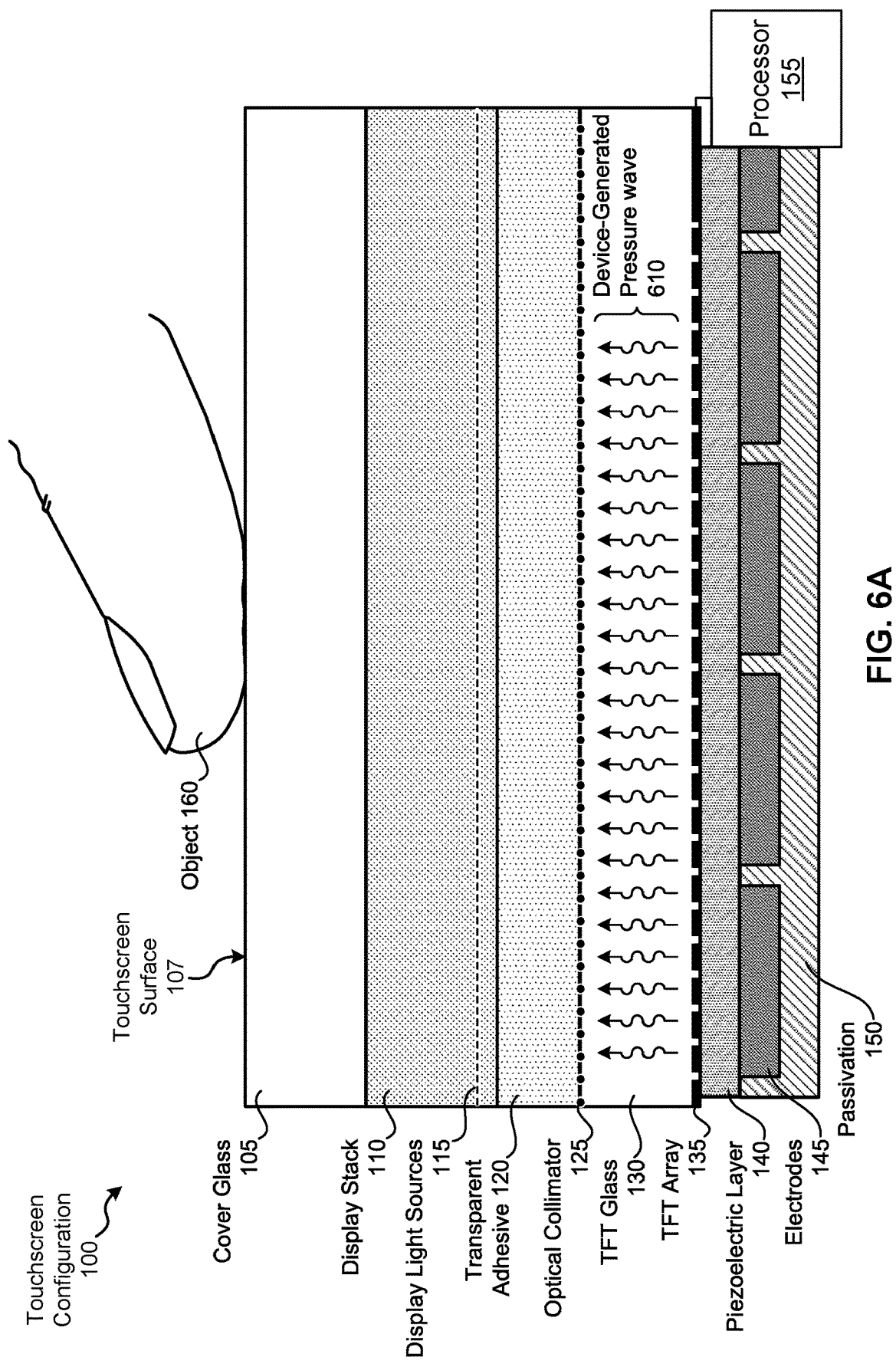
Figure 6C:
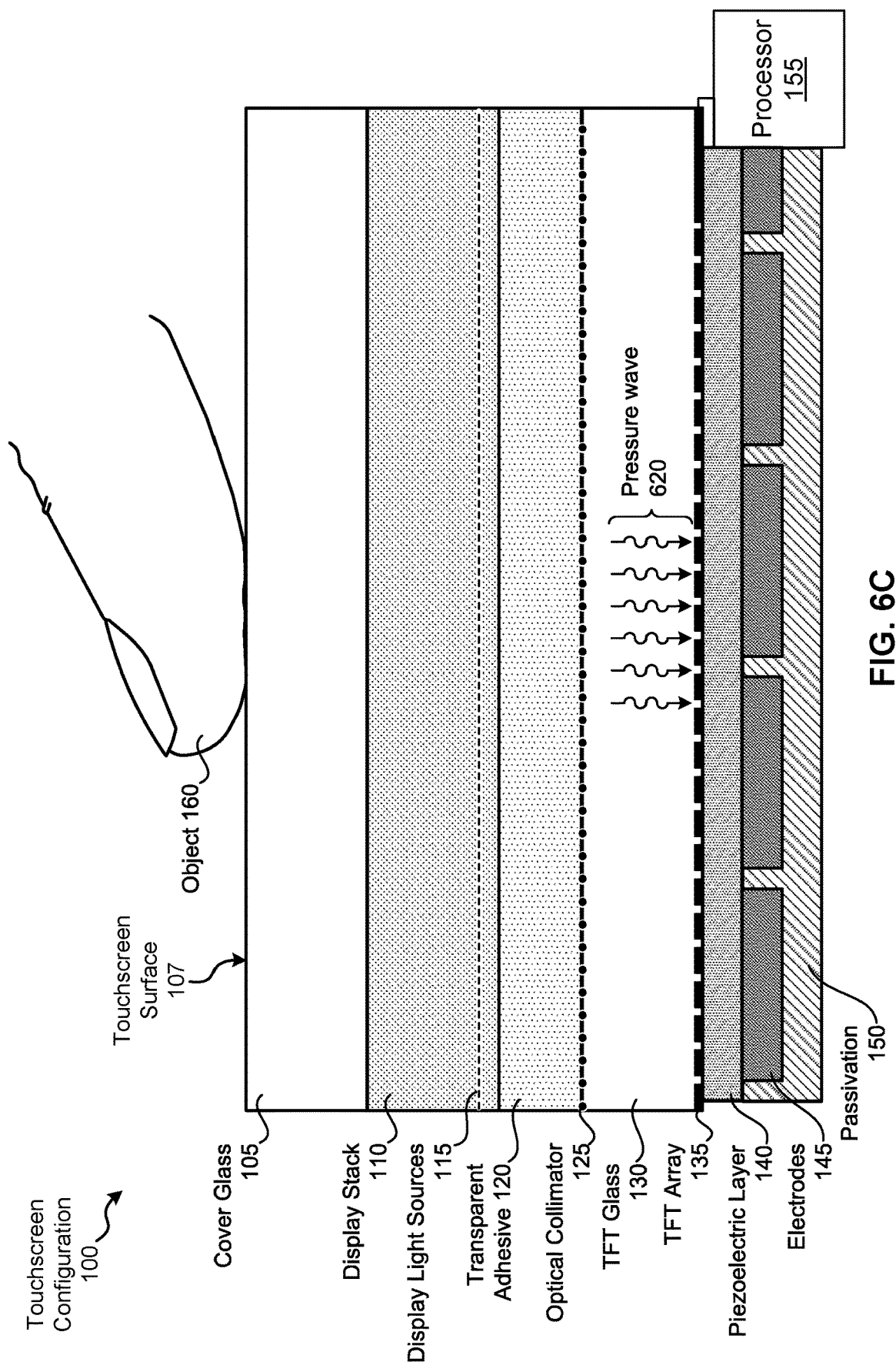

FIGS. 6A-6C are cross-sectional diagrams of the touchscreen configuration 100, illustrating the operation of the various components thereof for pressure wave generation in a pressure-sensing mode, according to some embodiments. The process uses pressure wave generation and sensing in a manner similar to the generation and sensing in the light-sensing mode shown in FIGS. 6A-6C. However, as previously noted, pressure sensing can be used to detect pressure waves when the object 160 presses or taps against the touchscreen surface 107. And thus, pressure wave generation by the piezoelectric layer 140 as illustrated in 6A-6C may be performed in certain situations where pressure wave generation can be advantageous, such as when the object 160 is a finger, and a fingerprint scan is desired.

In FIG. 6A, the piezoelectric layer 140 is used to create a device-generated pressure wave 610. As previously indicated, this can be done by grounding the receiver electrodes 440 in pixels 320 in the TFT sensor circuitry 310 of the TFT array 135, and providing a transmission voltage at one or more of the electrodes 145 (e.g., from one or more outputs of the processor 155). Based on the electrodes 145 for which a transmission voltage is provided, the device-generated pressure wave 610 may be local to an area of interest on the touchscreen surface 107, or may be global to the entirety of the touchscreen surface 107.

The device-generated pressure wave 610 then travels upward through the various components of the touchscreen configuration 100 toward the object 160 in contact with the touchscreen surface 107. As previously noted, the various components of the touchscreen configuration 100 can be tuned to reduce acoustic impedance and attenuation and increase acoustic coupling between the components.

In FIG. 6B, the device-generated pressure wave reflects off the object 160 at the touchscreen surface 107. The pressure wave 620 then travels downward through the cover glass 105 and the lower layers of the touchscreen configuration 100. In FIG. 6C, when the pressure wave 620 reaches the TFT array 135, it is detected by the piezoelectric sensor elements 410 of certain pixels 320 in the TFT sensor circuitry 310. Based on the location of the pixels 320, the location of the object 160 on the touchscreen surface 107 can be determined.

As noted above, pressure wave detection may occur whether or not a device-generated pressure wave 610 is used. In a "passive receive mode," for example, no device-generated pressure wave 610 is used. That is object 160 comes in contact with the touchscreen surface 107, it may generate a pressure wave 620 that may be detected by the piezoelectric sensor elements 410. In such cases, the process of detection would follow the description above with regard to FIGS. 6B-6C.

The light-sensing and pressure sensing processes illustrated in respective FIGS. 5A-5C and FIGS. 6A-6C can scan a fingerprint where the object 160 on the touchscreen surface 107 is a finger. Because the touchscreen configuration 100 is capable of both optical and pressure sensing, it may be capable of leveraging the benefits of both types of sensing for enhanced functionality. For example, where purely light-sensing may be spoofed, the touchscreen configuration 100 can utilize pressure sensing in addition or as an alternative to light-sensing for fingerprint scanning period, to detect features of a finger (e.g. pulse rate, impedance, etc.) that are difficult to spoof.

Additionally or alternatively, embodiments may utilize a "best-fit mode" of fingerprint scanning where the touchscreen configuration 100 is able to use one mode of fingerprint scanning if circumstances dictate that the other mode of fingerprint scanning would not be desirable. For example, the fingerprint of a finger that is wet may be easily scanned using the pressure-sensing mode, but may be difficult to scan using the optical mode. Other circumstances (e.g., the use of a screen protector) may weigh using the optical mode rather than the pressure-sensing mode.

Figure 7:
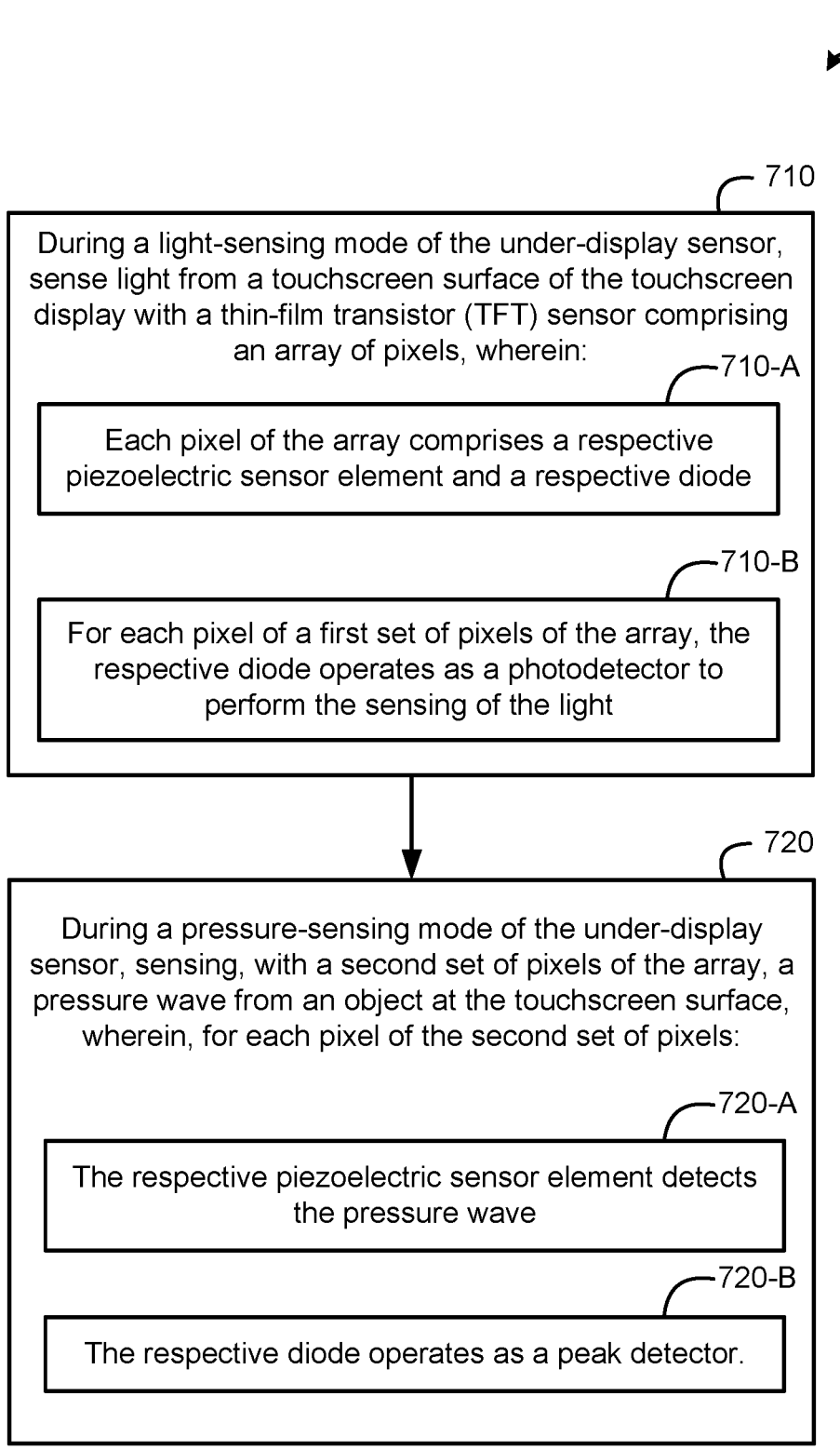
FIG. 7 is a flow diagram of a method of operating an under-display sensor for a touchscreen display.

FIG. 7 is a flow diagram of a method 700 of operating an under-display sensor for a touchscreen display. Alternative embodiments may vary in function by combining, separating, or otherwise varying the functionality described in the blocks illustrated in FIG. 7. Means for performing the functionality of one or more of the blocks illustrated in FIG. 7 may comprise one or more components of a touchscreen configuration, such as the touchscreen configuration 100 illustrated in FIG. 1. Such means may further include software means, which may be executed by a processor (e.g., processor 155 of FIG. 1).

At block 710, the functionality includes, during a light-sensing mode of the under-display sensor, sensing light from a touchscreen surface of the touchscreen display with a TFT sensor comprising an array of pixels. As illustrated in the embodiments above, the additional features illustrated in blocks 710-A and 710-B may be present. That is, as provided in block 710-A, each pixel of the array comprises a respective piezoelectric sensor element and the respective diode. Moreover, as shown in block 710-B, for each pixel of the first set of pixels of the array, the respective diode operates as a photodetector to perform the sensing of the light.

As noted in the embodiments above, the under-display sensor can include one or more additional features when performing light sensing. For example, in some embodiments, the method 700 may further comprise collimating the light reflected from the touchscreen surface. In some embodiments, collimating the light is performed by an optical collimator. The optical collimator may comprise a micro-lens array or a first layer having a plurality of transparent regions and opaque regions. Where the optical collimator comprises a first layer having a plurality of transparent regions and opaque regions, embodiments may further comprise a second layer having a plurality of transparent regions and opaque regions, where the first layer and the second layer are separated by one or more layers of material (e.g., separation layer 250 of FIG. 2B). In some embodiments, the one or more layers of material may have a thickness of at least 10 µm. The under-display sensor may further comprise a glass layer having a first surface coupled to the TFT sensor and a second surface opposite the first surface, and a transparent adhesive layer coupling the optical collimator to the second surface of the glass layer. In such embodiments, the first layer may comprise a metal layer deposited on the second surface of the glass layer. Depending on manufacturing processes and/or other factors, the metal layer may comprise copper or nickel, for example. Additionally, photodetectors are capable of sensing light reflected off of the internal surface of the display and/or light generated from outside the display. Light generated from outside the display can include, for example, light reflecting off of or generated by an object at and/or near the surface (e.g., sunlight reflecting off of a finger, light generated by a stylus or pen, etc.). Thus, the light from the touchscreen surface of the touchscreen display can include internally-generated light reflected by the touchscreen surface and/or externally-generated light passing through the touchscreen surface. In some embodiments of the method 700, the sensing of the light from the touchscreen surface of the touchscreen display at block 710 may therefore comprise sensing light generated by one or more light sources of the display and reflected off of the object at the surface of the touchscreen.

At block 720, the functionality comprises, during a pressure-sensing mode of the under-display sensor, sensing, with a second set of pixels of the array, a pressure wave from an object at a surface of the touchscreen where, for each pixel of the second set of pixels, the features of block 720-A and 720-B are present. Specifically, at block 720-A, the respective piezoelectric sensor element detects the pressure wave, and, at block 720-B, the respective diode operates as a peak detector. As described above and illustrated in FIG. 4A, the diode (photosensitive diode 420) can operate as a peak detector simply by conducting current in one direction to allow the piezoelectric sensor element to collect charge, which can be read during pixel readout. The first and second sets of pixels may or may not be the same, depending on where the object is during light- and pressure-sensing modes. Thus, there may be instances in which one or more pixels in the array are in both first and second sets of pixels.

As noted previously, the pressure wave can be generated by a force applied by the objects to the surface of the touchscreen, or may be a reflection of a generated pressure wave by the object at the surface of the touchscreen. In some embodiments of the method 700, therefore, the method may further comprise creating, during the pressure-sensing mode of the under-display sensor, a generated pressure wave in the touchscreen using a piezoelectric layer coupled with the TFT sensor, and one or more electrodes coupled with the piezoelectric layer. The pressure wave sensed with the second set of pixels, then, is a reflection of the generated pressure wave from the object at the surface of the touchscreen. As previously noted herein, the generated pressure wave may comprise an ultrasonic pulse with a frequency between 5 and 40 MHz. The location of the pressure wave with respect to the touchscreen may be determined by which of the one or more electrodes are used to cause the piezoelectric layer to generate the pressure wave. As previously noted, an electrode layer may be patterned to form the one or more electrodes. Alternatively, the one or more electrodes may simply comprise a single (e.g., blanket) electrode layer.

It will be apparent to those skilled in the art that substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

With reference to the appended figures, components that can include memory, such as processor 155 of FIG. 1, can include non-transitory machine-readable media. The term "machine-readable medium" and "computer-readable medium" as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including but not limited to, non-volatile media, volatile media, and transmission media. Common forms of computer-readable media include, for example, magnetic and/or optical media, any other physical medium with patterns of holes, a RAM, a PROM, EPROM, a FLASH-EPROM, any other memory chip or cartridge, a carrier wave as described hereinafter, or any other medium from which a computer can read instructions and/or code.

The methods, systems, and devices discussed herein are examples. Various embodiments may omit, substitute, or add various procedures or components as appropriate. For instance, features described with respect to certain embodiments may be combined in various other embodiments. Different aspects and elements of the embodiments may be combined in a similar manner. The various components of the figures provided herein can be embodied in hardware and/or software. Also, technology evolves and, thus, many of the elements are examples that do not limit the scope of the disclosure to those specific examples.

It has proven convenient at times, principally for reasons of common usage, to refer to such signals as bits, information, values, elements, symbols, characters, variables, terms, numbers, numerals, or the like. It should be understood, however, that all of these or similar terms are to be associated with appropriate physical quantities and are merely convenient labels. Unless specifically stated otherwise, as is apparent from the discussion above, it is appreciated that throughout this Specification discussions utilizing terms such as "processing," "computing," "calculating," "determining," "ascertaining," "identifying," "associating," "measuring," "performing," or the like refer to actions or processes of a specific apparatus, such as a special purpose computer or a similar special purpose electronic computing device. In the context of this Specification, therefore, a special purpose computer or a similar special purpose electronic computing device is capable of manipulating or transforming signals, typically represented as physical electronic, electrical, or magnetic quantities within memories, registers, or other information storage devices, transmission devices, or display devices of the special purpose computer or similar special purpose electronic computing devices.

Terms, "and" and "or" as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AA, AAB, AABBCCC, etc.

Having described several embodiments, various modifications, alternative constructions, and equivalents may be used without departing from the spirit of the disclosure. For example, the above elements may merely be a component of a larger system, wherein other rules may take precedence over or otherwise modify the application of the various embodiments. Also, a number of steps may be undertaken before, during, or after the above elements are considered. Accordingly, the above description does not limit the scope of the disclosure.

What is claimed is:

1. An under-display sensor for a touchscreen display, the under-display sensor comprising:
   a thin-film transistor (TFT) sensor comprising an array of pixels, wherein each pixel in the array of pixels comprises:
      a piezoelectric sensor element, and
      a diode configured for use as:
         a peak detector during a pressure-sensing mode of the under-display sensor, and
         a photodetector during a light-sensing mode of the under-display sensor;
   a piezoelectric layer coupled with the TFT sensor;

one or more electrodes coupled with the piezoelectric layer;

a glass layer having a first surface coupled to the TFT sensor and a second surface opposite the first surface; and an optical collimator coupled to the second surface of the glass layer.

2. The under-display sensor of claim 1, further comprising a transparent adhesive layer coupling the optical collimator to the second surface of the glass layer.

3. The under-display sensor of claim 1, wherein the optical collimator comprises a first layer having a plurality of transparent regions and opaque regions.

4. The under-display sensor of claim 3, wherein the optical collimator further comprises a second layer having a plurality of transparent regions and opaque regions, wherein the first layer and the second layer are separated by one or more layers of material having a thickness of at least 10 µm.

5. The under-display sensor of claim 3, wherein the first layer comprises a metal layer deposited on the second surface of the glass layer.

6. The under-display sensor of claim 5, wherein the metal layer comprises copper or nickel.

7. The under-display sensor of claim 1, wherein the optical collimator comprises an optical micro-lens array.

8. A method of operating an under-display sensor for a touchscreen display, the method comprising:
during a light-sensing mode of the under-display sensor:
collimating light from a touchscreen surface of the touchscreen display, and
sensing the light from the touchscreen surface with a thin-film transistor (TFT) sensor comprising an array of pixels, wherein:
each pixel of the array comprises a respective piezoelectric sensor element and a respective diode, and
for each pixel of a first set of pixels of the array, the respective diode operates as a photodetector to perform the sensing of the light; and
during a pressure-sensing mode of the under-display sensor sensing, with a second set of pixels of the array, a pressure wave from an object at the touchscreen surface, wherein, for each pixel of the second set of pixels:
the respective piezoelectric sensor element detects the pressure wave, and
the respective diode operates as a peak detector.

9. The method of claim 8, wherein sensing the light from the touchscreen surface of the touchscreen display comprises sensing light generated by one or more light sources of the touchscreen display and reflected off of the object at the touchscreen surface of the touchscreen display.

10. The method of claim 8, further comprising creating, during the pressure-sensing mode of the under-display sensor, a generated pressure wave in the touchscreen display using:
a piezoelectric layer coupled with the TFT sensor, and
one or more electrodes coupled with the piezoelectric layer;
wherein the pressure wave sensed with the second set of pixels is a reflection of the generated pressure wave from the object at the touchscreen surface of the touchscreen display.

11. The method of claim 8, wherein collimating the light is performed by an optical collimator, and the under-display sensor further comprises:

a glass layer having a first surface coupled to the TFT sensor and a second surface opposite the first surface; and a transparent adhesive layer coupling the optical collimator to the second surface of the glass layer.

12. The method of claim 11, wherein the optical collimator comprises a metal layer deposited on the second surface of the glass layer.

13. The method of claim 12, wherein the metal layer comprises copper or nickel.

14. The method of claim 8, wherein an optical collimator collimates the light, the optical collimator comprising a first layer having a plurality of transparent regions and opaque regions.

15. The method of claim 14, wherein the optical collimator further comprises a second layer having a plurality of transparent regions and opaque regions, wherein the first layer and the second layer are separated by one or more layers of material having a thickness of at least 10 µm.

16. The method of claim 8, wherein an optical collimator collimates the light, the optical collimator comprising an optical micro-lens array.

17. The method of claim 8, further comprising generating one or more light pulses using one or more light sources of the touchscreen display, wherein the pressure wave from the object at the touchscreen surface of the touchscreen display is generated by the object in response to the object absorbing the one or more light pulses.

18. The method of claim 8, wherein one or more pixels in the array of pixels are in both the first set of pixels and the second set of pixels.

19. An under-display sensor for a touchscreen display, the under-display sensor comprising:
means for sensing light from a touchscreen surface of the touchscreen display, during a light-sensing mode of the under-display sensor, wherein the means for sensing light comprises an array of pixels, and wherein:
each pixel of the array comprises a respective pressure-sensing means and a respective diode, and
for each pixel of a first set of pixels of the array, the respective diode is configured to operate as a photodetector to perform the sensing of the light;
means for comprising means for collimating the light from the touchscreen surface; and
means for sensing a pressure wave from an object at the touchscreen surface during a pressure-sensing mode of the under-display sensor sensing, wherein the means for sensing the pressure wave comprise a second set of pixels of the array, and, for each pixel of the second set of pixels:
the respective pressure-sensing means is configured to detect the pressure wave, and
the respective diode is configured to operate as a peak detector.

20. The under-display sensor of claim 19, wherein the means for sensing the light is configured to sense light reflected off of the object at the touchscreen surface of the touchscreen display.

21. The under-display sensor of claim 19, further comprising means for creating, during the pressure-sensing mode of the under-display sensor, a generated pressure wave in the touchscreen display, wherein the second set of pixels is configured to sense the pressure wave at least in part by sensing a reflection of the generated pressure wave from the object at the touchscreen surface of the touchscreen display.

22. The under-display sensor of claim 19, wherein the means for collimating the light from the touchscreen surface comprises a first layer having a plurality of transparent regions and opaque regions.

23. The under-display sensor of claim 22, wherein the means for collimating the light from the touchscreen surface further comprises a second layer having a plurality of transparent regions and opaque regions, wherein the first layer and the second layer are separated by one or more layers of material having a thickness of at least 10 μm.

24. The under-display sensor of claim 19, wherein the means for collimating the light from the touchscreen surface comprises an optical micro-lens array.

25. The under-display sensor of claim 19, wherein, to cause the object at the touchscreen surface of the touchscreen display to generate the pressure wave by absorbing one or more light pulses, the under-display sensor further comprises means for generating the one or more light pulses.

26. A non-transitory, computer-readable medium having instructions stored thereby for operating an under-display sensor for a touchscreen display, wherein the instructions, when executed by one or more processors, cause the one or more processors to:
  cause the under-display sensor to enter a light-sensing mode in which a thin-film transistor (TFT) sensor comprising an array of pixels is configured to sense collimated light from a touchscreen surface of the touchscreen display, wherein:
    each pixel of the array comprises a respective piezoelectric sensor element and a respective diode, and
    for each pixel of a first set of pixels of the array, the respective diode is configured to operate as a photodetector to perform the sensing of the light; and
  cause the under-display sensor to enter a pressure-sensing mode in which a second set of pixels of the array is configured to sense a pressure wave from an object at the touchscreen surface, wherein, for each pixel of the second set of pixels:
    the respective piezoelectric sensor element is configured to detect the pressure wave, and
    the respective diode is configured to operate as a peak detector.

27. The non-transitory, computer-readable medium of claim 26, to sense the light from the touchscreen surface of the touchscreen display, the instructions, when executed by one or more processors, further cause the one or more processors to cause one or more light sources of the touchscreen display to generate the light such that the light is reflected off of the object at the touchscreen surface of the touchscreen display.

* * * * *